United States Patent [19]

Neiger et al.

[11] Patent Number: 4,937,496
[45] Date of Patent: Jun. 26, 1990

[54] XENON SHORT ARC DISCHARGE LAMP

[75] Inventors: Manfred Neiger, Karlsruhe; Reiner Hoppstock, Munich; Bernd Kleiner, Karlsruhe, all of Fed. Rep. of Germany

[73] Assignee: W. C. Heraeus GmbH, Hanau, Fed. Rep. of Germany

[21] Appl. No.: 302,594

[22] PCT Filed: May 5, 1988

[86] PCT No.: PCT/EP88/00381
§ 371 Date: Jan. 13, 1989
§ 102(e) Date: Jan. 13, 1989

[87] PCT Pub. No.: WO88/09565
PCT Pub. Date: Dec. 1, 1988

[30] Foreign Application Priority Data

May 16, 1987 [DE] Fed. Rep. of Germany ....... 3716485

[51] Int. Cl.⁵ .................. H01J 17/06; H01J 61/16; H01S 3/09
[52] U.S. Cl. .................. 313/632; 313/620; 313/637; 313/643; 372/69
[58] Field of Search ............ 313/632, 637, 620, 570, 313/571, 643; 372/69, 72

[56] References Cited

U.S. PATENT DOCUMENTS

| 1,334,150 | 3/1920 | Green et al. | 313/620 X |
| 3,259,777 | 7/1966 | Fridrich | 313/570 |
| 3,706,000 | 12/1972 | Retzer et al. | 313/620 X |
| 3,714,493 | 1/1973 | Fridrich | 313/637 X |
| 3,902,090 | 8/1975 | Ekkelboom | 313/620 |

FOREIGN PATENT DOCUMENTS 1814095 6/1969 Fed. Rep. of Germany .
297983 4/1954 Switzerland .

OTHER PUBLICATIONS

W. Thouret et al., "High-Brightness Xenon Lamps", Sep. 1964 Illuminating Engineering, vol. 9, pp. 589-591.
C. F. Gallo, Applied Optics, vol. 10, No. 11, Nov. 1971, "Continuum Emission Spectra from Long Linear Xenon Lamps".
K. Luttio et al., "Xenon Short Arc Lamps . . . " Soc. Motion Picture & TV Eng. Jour., Feb. 1983, vol. 92, No. 2.

Primary Examiner—Sandra L. O'Shea
Attorney, Agent, or Firm—Frishauf, Holtz, Goodman & Woodward

[57] ABSTRACT

A xenon short arc discharge lamp has a lamp bulb (1) of quartz glass, into which two rod-shaped electrodes (4, 5) protrude, the spacing of which is shorter than the diameter of the shaft (8) of the cathode (5); the cathode (5) is provided with a conical, obtuse tip (9). By doping with a metal halide, such as thallium iodide, the spectral radiant intensity per unit area in the plasma zone immediately in front of the cathode (5) is increased substantially compared with an undoped xenon short arc discharge lamp, and as a result of a flow-controlled tungsten-halogen cycle process, a stabilized cathode spot operation is attained, and the inner wall of the lamp bulb (1) remains free of tungsten deposits.

16 Claims, 2 Drawing Sheets

XENON SHORT ARC DISCHARGE LAMP

The invention relates to a xenon short arc discharge lamp having a high-pressure-proof bulb, at least the transparent zone of which comprises quartz glass. Two opposed rod-shaped electrodes located on one axis protrude into the bulb, and the anode has a larger diameter than the cathode. The bulb has a fill pressure of at least one bar in the non-operating state and an electrode spacing that is shorter than the diameter of the shaft of the cathode.

BACKGROUND

Short arc lamps, in particular xenon high-pressure short arc lamps, have the highest radial intensities per unit area of all known lamps, as well as an arc of very small diameter and very short length. To a good approximation, they are punctiform light sources, and are correspondingly used in projection systems of all kinds, such as film projectors, arc furnaces, photolithography, and in other optical equipment having high radiant intensities per unit area. They include a high-pressure-proof bulb with a spherical or ellipsoid discharge space, for instance of quartz glass; electrodes that as anodes and cathodes are connectable to a source of direct voltage, and comprise tungsten or tungsten with additives; and current ducts fused into the bulb, such as single or multiple molybdenum ribbon ducts or molybdenum cap ducts. Known short arc lamps may include fillings of xenon, mercury, argon, tin or zinc. A mercury lamp requires several minutes to warm up to full operating pressure and light output. This warm-up time is reduced by about 50 percent if xenon at a pressure exceeding one atmosphere is added to the mercury.

From British Patent No. 1,603,699, a short arc lamp of this type filled with xenon and mercury is known. For the electrode spacings in such lamps, which are also known as electrode-stabilized discharge lamps, figures of less than 10 mm to less than 1 mm are given.

A xenon short arc discharge lamp with a bulb of quartz glass and two opposed rod-shaped electrodes is also known from the journal "Illuminating Engineering", Vol. 59, 1964, No. 9, pp. 589–591. The anode has a larger diameter than the cathode; the electrode spacing is shorter than the shaft of the cathode, and the cathode tip is conical.

In the journal "Applied Optics", Vol. 10, 1971, No. 11, pp. 2517–2520, a xenon discharge lamp is described which may contain, in addition to xenon, a doping substance such as thallium iodide.

A xenon short arc discharge lamp is also known from Swiss Patent No. 297 983, in which the electrodes are as close as from 0.5 to 2 mm to one another, so that the positive column of the discharge is suppressed, and the lamp radiates only in the cathode spot. The lamp filling, which is of heavy noble gas (xenon), may have a doping gas having an atomic weight of less than 21 added to it.

In a such a case, the doping merely causes an additional appearance of spectral lines of the doping substance at reduced plasma temperature.

THE INVENTION

Based on the known short arc discharge lamps, it is the object of the invention to increase the radiant intensity per unit area of previously known short arc lamps considerably, the goal being as punctiform a discharge zone as possible, without blackening of the lamp bulb and without sacrifices in terms of burn stability.

This object is attained in accordance with the invention by. The term metal halides is also understood to include the rare earth metal halides.

In a preferred embodiment, the bulb of the lamp is completely of quartz glass. Metal halides have been inserted as doping substances. The use of thallium iodide as doping material has proved to be particularly suitable, because with it a lowering of the plasma temperature can be avoided. Instead, the plasma temperature can be increased, and thus the radiant intensity per unit area as compared with an undoped lamp is also increased. The increase of the radiant intensity per unit area is due substantially to a considerable increase in the continuum emission.

When metal iodides are used as the doping additive, a halide circuit (tungsten-halogen cycle process) is advantageously operative, in which the metal iodide dissociates in the hot zone of the discharge arc, so that in the gas discharge, the metals and the iodine appear in atomic form. Metal vapor, which is diffused toward the vessel wall, recombines there with the iodine and is transported as a halide back into the interior of the lamp, where it dissociates once again (JMürgen Kiefer, Ultraviolete Strahlen [Ultraviolet Rays] Walter de Gruyter Verlag, Berlin, 1977).

The truncated conical cathode tip proves to be particularly advantageous, because, as a result of the obtuseness, no further material disintegrates or remelts here during the duration of burning.

DRAWINGS

The subject of the invention will now be described in further detail, referring to FIGS. 1a, 1b and 2. FIGS. 1a and 1b show the structure of the short arc lamp with a quartz glass bulb according to the invention in logitudinal section;

FIG. 2 shows the spectrum of a thallium iodide-doped zenon lamp as well as the spectrum of an undoped lamp.

DETAILED DESCRIPTION

Figure 1:
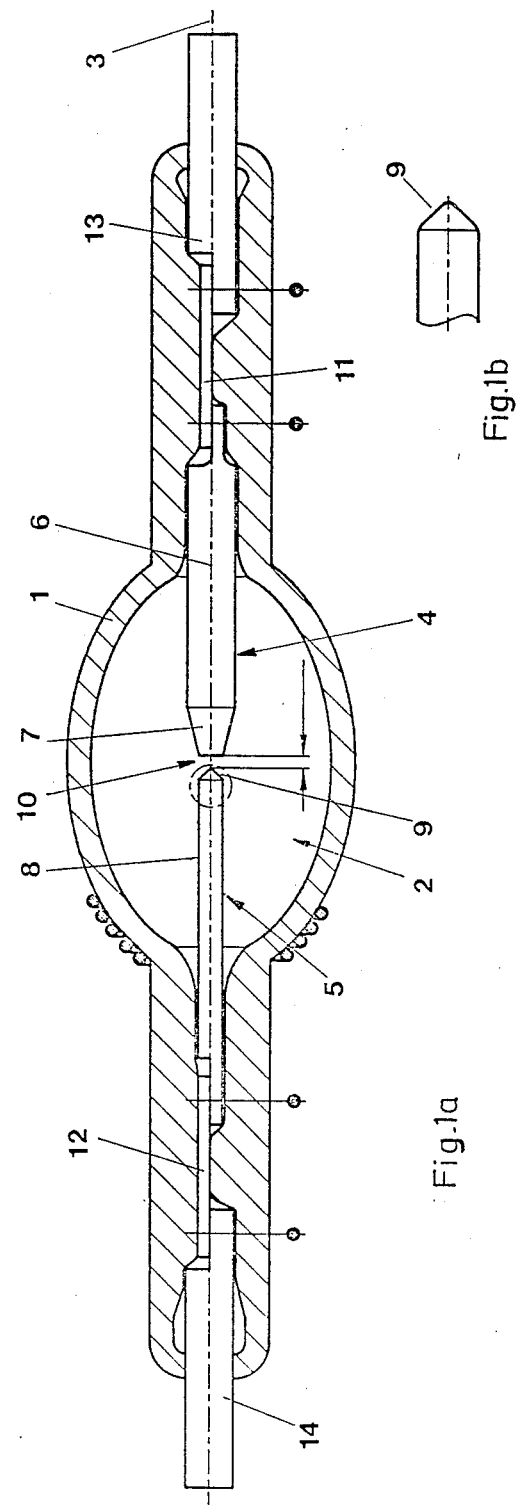

According to FIG. 1a, the short arc lamp according to the invention has a bulb 1 comprising quartz glass, having an ellipsoid discharge space 2. The electrodes 4 and 5 protrude into the discharge space 2 along the bulb axis 3; in this exemplary embodiment, the electrodes are of tungsten or tungsten with additives. The anode, manufactured from solid material, comprises a rod-shaped shaft 6, the tip 7, protruding into the discharge space, of which is formed as a truncated cone. The diameter of the shaft 6 amounts to from 3 to 5 mm, preferably 4 mm. The cathode 5, which is also of solid material, is disposed facing the anode 4; its electrode shaft 8 has a diameter of from 1 to 4 mm, preferably 2 mm, and the tip 9 protruding into the discharge space is conical. Between the anode and the cathode is the discharge path 10, which is shorter than the diameter of the cathode 5. The ends of the electrodes 4, 5 remote from the discharge space are each connected to the respective outer lamp contacts 13, 14 via one or more molybdenum foils 11, 12 sealed into the bulb in a pressure- and temperature-proof manner.

In FIG. 1b, the tip of the cathode, marked with a circle in FIG. 1a, is shown on a larger scale. From this drawing figure it can be seen that the cathode tip 9 is a slightly rounded cone, which is optimized in the sense that it neither disintegrates nor remelts. In longitudinal section, the tip of the cone has an angle in the range from 85° to 95°; as shown in FIG. 1b, an angle of 92° has proved particularly suitable. Since the discharge takes place relatively far from the bulb wall, it has no effect on the discharge stability.

The filling of the discharge space 2 comprises xenon, having a cold pressure of more than one bar, as well as doping substances. Because of the doping and the obtuse opening angle of the tip 9 of the cathode, a stable arc startup of the discharge becomes possible. The doping constricts the arc to such an extent that the radiant intensity per unit area upstream of the cathode is increased substantially, so that it is at least doubled. Thus on the one hand, the doping assures the constriction of the arc, and on the other hand assures the aforementioned cycle process, which allows no deposits, especially of tungsten, to form on the lamp bulb.

In operation with thallium iodide as the doping substance, a virtually punctiform cathode startup is produced. This punctiform startup produces a plasma sphere in front of the cathode, the emission of which, along with the thallium line, leads to a radiant intensity per unit area up to more than 10 times that of undoped xenon lamps. In this way, a very decisive improvement of doped xenon lamps as sources of punctiform light is attained.

Figure 2:
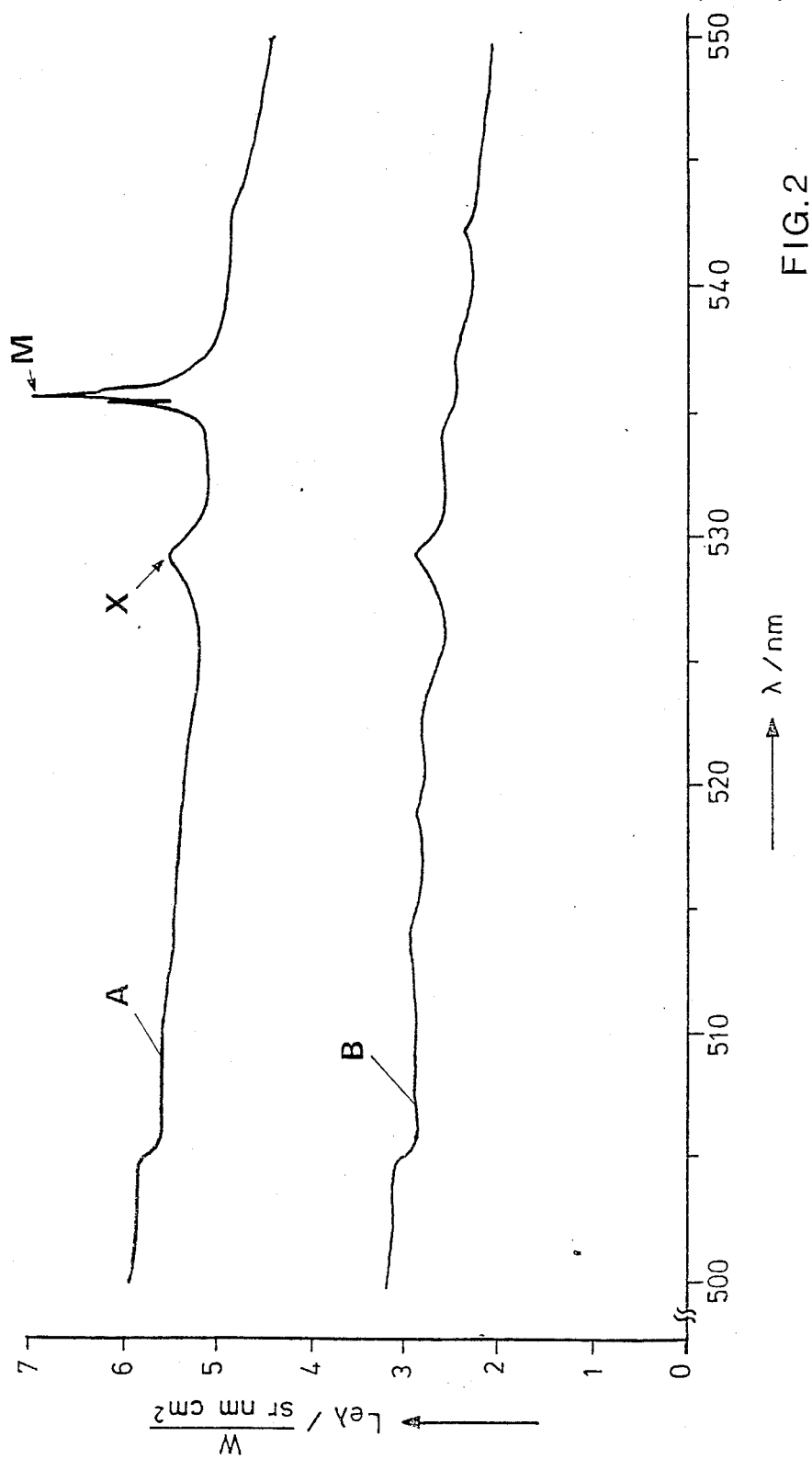

In FIG. 2, curve A shows the doubling of the spectral luminance in the plasma range of a thallium iodide-doped xenon lamp, compared with the spectral luminance in the plasma range of an undoped xenon lamp, shown in curve B. For curve A, the maximum, marked M, in the spectral luminance in the vicinity of 535 nm is particularly characteristic; this corresponds to the thallium line. The peak of the curve A, marked X, corresponds to a xenon ion line. As shown, the radiant intensity per unit area, in a spectral range between 500 nm and 550 nm, continuously exceeds 4 watts/sr·nm·cm$^2$.

The xenon high-pressure short arc lamp according to the invention regulates the extremely pronounced tungsten damping of the cathode spot operation as a result of a flow-controlled tungsten-halogen cycle process (1 to 20 meters per second flow speed); in this way, a stable cathode spot operation is attained, and the inside wall of the bulb remains free of tungsten deposits. It is also possible to use halides of the group IIb of the periodic system, in particular mercury iodide, as doping substances; alkali metal halides or rare earth metal halides can also be used as doping substances. It is also possible to use a mixture of these various halides.

The xenon high-pressure short arc lamp according to the invention can additionally be provided with an anode heat buildup groove in the form of an annular groove surrounding the anode; as a result, substantially higher specific anode loads are possible without damage to the vessel walls, which permits extremely high specific lamp loads (greater than 200 W/cm$^3$ and therefore extremely high operating pressures (greater than or equal to 80 bar). The electrode spacing is preferably in the range from 0.1 to 2 mm, and the wattage of the lamp is a maximum of one KW. According to the invention, an extremely constricted cathode spot operation is induced, which generates the highest known continuous beam radiant intensities per unit area (greater than 30 W/ccm*sr*nm), such as are desired, for instance, when the lamp is used as a pumping light source for continuous wave dye lasers.

I claim:

1. A xenon short arc discharge lamp comprising
a high-pressure-proof bulb (1), which, at least in a transparent zone thereof, comprises quartz glass,
two opposed rod-shaped electrodes (4, 5) located on a common axis (3) protruding into the bulb, of which the anode (4) has a larger diameter than the cathode (5),
a xenon filling in said bulb, at a pressure of at least one atmosphere or bar in the non-operating state, thereby providing rapid approximation of maximum final light output,
said electrodes (4, 5) being spaced from one another by a distance which is shorter than the diameter of the shaft (8) of the cathode (5), thereby approximating a punctiform light source,
wherein
the tip of the cathode (5) is at least partially conical, thereby minimizing tip melting and disintegration, and
the lamp includes at least one metal halide as a doping substance, thereby constricting arc size and increasing continuum emission radiant intensity.

2. A lamp as defined by claim 1, characterized in that the lamp bulb (1) is completely of quartz glass.

3. A lamp as defined by claim 1 or 2, characterized in that the spacing between the electrodes (4, 5) is selected as a function of the power consumption of the lamp.

4. A lamp as defined by claim 3, characterized in that it is adapted for a power consumption of up to 20 KW, the spacing (10) between the electrodes being in the range from 0.2 to 5 mm.

5. A lamp as defined by claim 1, characterized in that the doping substance is thallium iodide.

6. A lamp as defined by claim 1, characterized in that the doping substance is indium iodide.

7. A lamp as defined by claim 1, characterized in that the doping substance is gallium iodide.

8. A lamp as defined by claim 1, characterized in that the doping substance is potassium iodide.

9. A lamp as defined by claim 1, characterized in that the doping substance is an iodide of the group IIb of the periodic table.

10. A lamp as defined by claim 9, characterized in that the doping substance is mercury iodide.

11. A xenon short arc discharge lamp according to claim 1,
wherein said metal halide consists essentially of thallium oxide, and radiant intensity per unit area, in a spectral range between 500 nm and 550 nm, continuously exceeds 4 watts/sr·nm·cm$^2$.

12. A xenon short arc discharge lamp according to claim 2, wherein
the doping substance is an iodide of group IIb of the periodic table,
and wherein radiant intensity per unit area, in a spectral range between 500 nm and 550 nm, continuously exceeds 4 watts/sr·nm·cm$^2$.

13. A xenon short arc discharge lamp according to claim 3, wherein
the doping substance is an iodide of group IIb of the periodic table,
and wherein radiant intensity per unit area, in a spectral range between 500 nm and 550 nm, continuously exceeds 4 watts/sr·nm·cm$^2$.

14. A xenon short arc discharge lamp according to claim 4, wherein
the doping substance is an iodide of group IIb of the periodic table, and wherein radiant intensity per unit area, in a spectral range between 500 nm and 550 nm, continuously exceeds 4 watts/sr·nm·cm$^2$.

15. A xenon short arc continuous-wave-laser-pumping light source comprising
    a high-pressure-proof bulb (1), which, at least in a transparent zone thereof, comprises quartz glass,
    two opposed rod-shaped electrodes (4, 5) located on a common axis (3) protruding into the bulb, of which the anode (4) has a larger diameter than the cathode (5),
    a xenon filling inn said bulb, at a pressure of at least one atmosphere or bar in the non-operating state, thereby providing rapid approximation of maximum final light output,
    said electrodes (4, 5) being spaced from one another by a distance which is shorter than the diameter of the shaft (8) of the cathode (5), thereby approximating a punctiform light source,
    wherein
    the tip of the cathode (5) is at least partially conical, thereby minimizing tip melting and disintegration, and
    the lamp includes at least one metal halide as a doping substance, thereby constricting arc size and increasing continuum emission radiant intensity.

16. A laser light source according to claim 1,
    wherein said metal halide consists essentially of thallium oxide, and radiant intensity per unit area, in a spectral range between 500 nm and 550 nm, continuously exceeds 4 watts/sr·nm·cm$^2$.

* * * * *